United States Patent [19]

Miller

[11] 4,009,402
[45] Feb. 22, 1977

[54] TIME EXPANDER CIRCUIT FOR A FREQUENCY-TO-DIGITAL CONVERTER

[75] Inventor: Floyd V. Miller, Richfield, Minn.

[73] Assignee: Sperry Rand Corporation, New York, N.Y.

[22] Filed: Aug. 20, 1975

[21] Appl. No.: 606,143

[52] U.S. Cl. .............................. 307/267; 307/246; 328/58

[51] Int. Cl.² .................. H03K 1/18; H03K 17/60

[58] Field of Search ............. 328/58; 307/265, 267, 307/246

[56] References Cited

UNITED STATES PATENTS

| | | | |
|---|---|---|---|
| 3,346,743 | 10/1967 | Strenglein | 307/267 |
| 3,473,050 | 10/1969 | Groom | 307/267 |
| 3,712,990 | 1/1973 | Gordon | 307/267 X |
| 3,712,992 | 1/1973 | Schertz et al. | 307/267 |
| 3,712,993 | 1/1973 | Edison | 307/267 |
| 3,731,206 | 5/1973 | Veale | 328/58 |

Primary Examiner—John S. Heyman
Attorney, Agent, or Firm—Kenneth T. Grace; Thomas J. Nikolai; Marshall M. Truex

[57] ABSTRACT

A circuit for generating a relatively-long-duration timing signal whose duration is a fixed multiple of the duration of a variable, relatively-short duration gating signal. The circuit utilizes a constant current source, for charging an RC timing circuit, and a constant current sink that are intercoupled by a first switching means. The gating signal closes the first switching means permitting the RC timing circuit to discharge through the constant current sink at a constant rate over the duration of the gating signal. The closing of the first switch means operates to open a second switch means that is coupled to the RC timing circuit at the same node as is the first switch means. The second switch means remains open during the time the RC timing circuit is being recharged at a linear or constant rate by the constant current source back to its initial level.

3 Claims, 5 Drawing Figures

TIME EXPANDER CIRCUIT FOR A FREQUENCY-TO-DIGITAL CONVERTER

The invention herein described was made in the course of or under a contract or subcontract thereunder, with the Department of the Navy.

BACKGROUND OF THE INVENTION

In the field of frequency-to-digital converters, it is a practice to count, over a predetermined sample time $T_S$, the number of cycles $N_I$ of the input signal of unknown frequency $F_I$. This input signal count is then divided by the time $T_I$ of the number of cycles $N_I$ to provide the determined frequency $F_I = N_I \div T_I$ that is then provided in digital form in a binary code.

To provide an accurate realization of the frequency $F_I$, a relatively high frequency asynchronous clock signal of a predetermined frequency $F_C$ and of a predetermined number of counts $N_C$ of clock signal pulses is used to establish the time $T_C$, i.e., $T_C = N_C F_C$. However, because the clock signal is asynchronous with respect to the input signal, the time differences between the integral number of input signal counts $N_I$ and the integral number of clock signal counts $N_C$ over the sample time $T_S$ during which the input signal is to be sampled must be separately determined and then added to and/or subtracted from the time $T_C$ to provide an accurate determination of the time separation between the first and the last of the counted input signal pulses $N_I$, i.e. the lead, i.e., $\Delta T_L$, of the leading first input signal pulse re the corresponding clock signal pulse is added to the time $T_C$ while the lag, i.e., $\Delta T_T$, of the lagging corresponding clock signal pulse re the last input signal pulse is subtracted from the time $T_C$, i.e., $$F_I = N_I \div [T_C + (\Delta T_L - \Delta T_T)]$$

where the time $$T_I = T_C + (\Delta T_L - \Delta T_T)$$

and the sample time $$T_S = T_C + \Delta T_L.$$

The determination of these correcting time durations, $\Delta T_L$ and $\Delta T_T$, if of extremely short durations such as when the frequencies $F_I$ and $F_C$ concerned are in the megacycle (MHz) range, are extremely difficult to accurately determine. Such determinations require extremely accurate measuring techniques to provide the required accuracy in the determination of the frequency $F_I$.

SUMMARY OF THE INVENTION

The circuit of the present invention provides a means for the accurate determination of the correcting time durations $\Delta T_L$ and $\Delta T_T$ even though such durations may be in the nanosecond (ns) range, e.g., 100 ns in duration. A signal of the correcting time duration, e.g., $\Delta T_L$, is used as a gating signal that permits an RC timing circuit, previously charged by a constant current source, to discharge at a constant rate over the duration of the gating signal, i.e., $\Delta T_L$, into a constant current sink. At the termination of the gating signal, the RC timing circuit is recharged by a constant current source at a constant rate, i.e., a linear change of voltage VD with respect to time, that is substantially slower than the discharging rate. The duration of the discharging period plus the duration of the recharging period, e.g., 100 microseconds (us), is of a sufficiently long duration with respect to the duration of the discharging period, e.g., 100 nanoseconds (ns), to provide, when reduced by the exact ratio of, e.g., 1000:1 an extremely accurate determination or measurement of the length of the extremely short duration gating pulse, and, correspondingly, the correcting time duration $\Delta T_L$ (and in a like manner $\Delta T_T$).

DESCRIPTION OF THE PREFERRED EMBODIMENT

Figure 1:
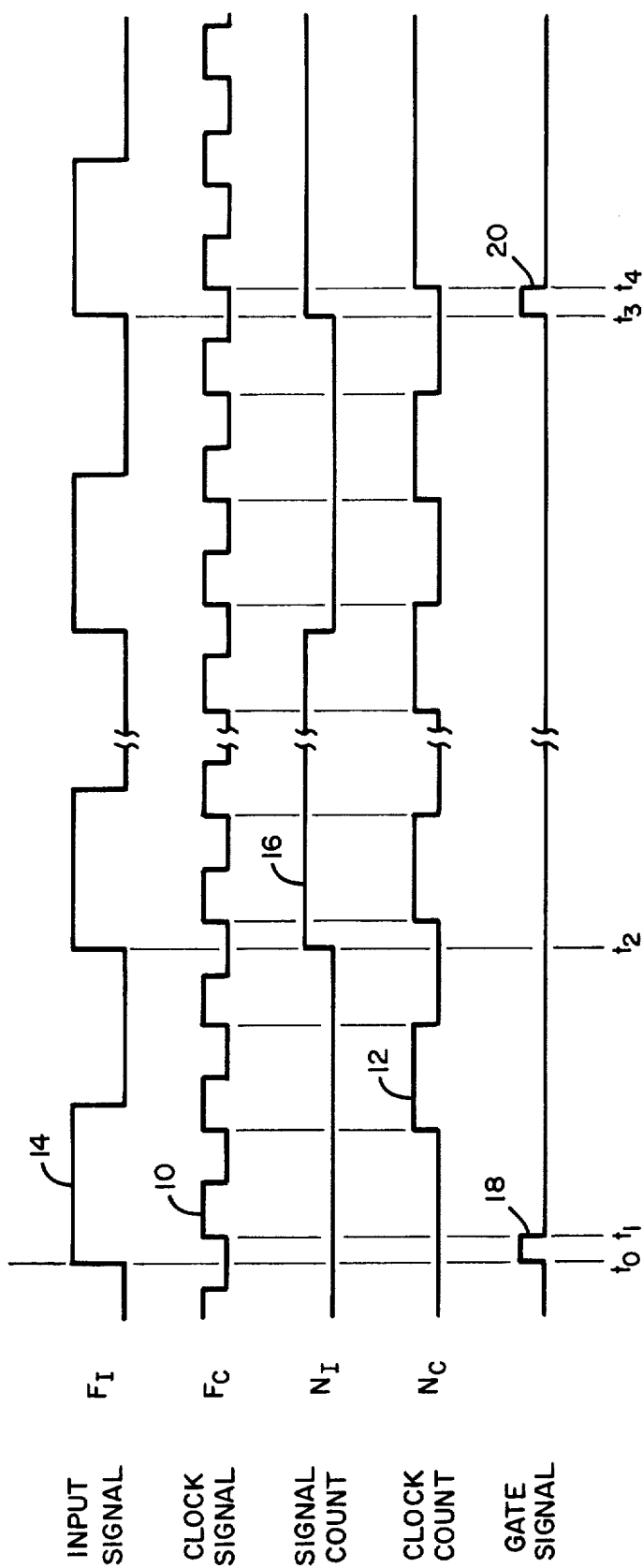
FIG. 1 is an illustration of a set of waveforms of a timing diagram of a frequency-to-digital converter for which the time expander circuit of the present invention is to be utilized.
Figure 2:
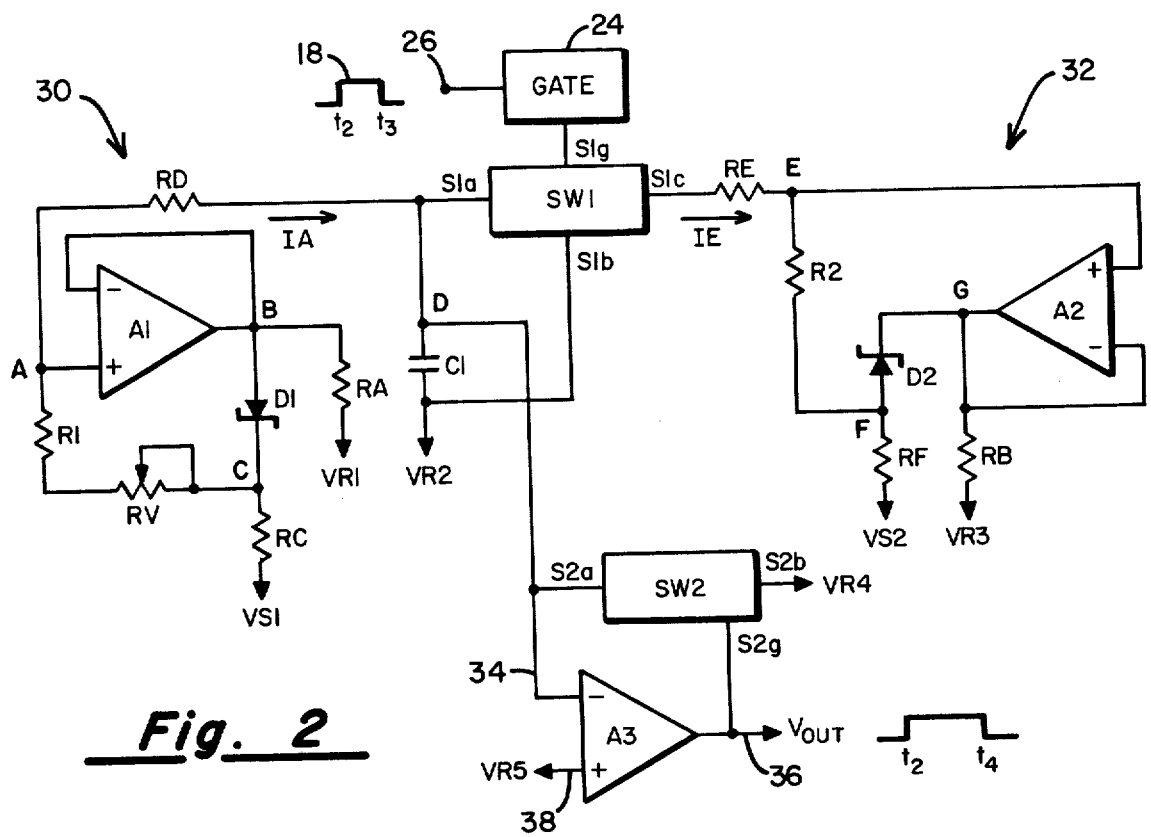
FIG. 2 is a detail circuit schematic of the time expander circuit of the present invention.

With particular reference to FIG. 1 there is presented an illustration of a set of waveforms of a timing diagram of a frequency-to-digital converter for which the time expander circuit of FIG. 2 is to be utilized. In the frequency-to-digital converter exemplified by the timing diagram of FIG. 1, there is utilized a constant running clock signal 10 of a frequency $F_C$ which produces the clock count 12. Asynchronous with respect to clock signal 10 of frequency $F_C$ there is illustrated an input signal 14 of unknown frequency $F_I$ the frequency of which is to be determined by the frequency-to-digital converter. From input signal 14 of unknown frequency $F_I$, there is generated a signal count 16 of the number $N_I$ of cycles of input signal 14 over a sample time $T_S$, which sample time is initiated by the first positive going leading edge of a first pulse of the input signal 14, as at time $t_0$, through to the positive going leading edge of the clock signal 10 of frequency $F_C$, as at time $t_4$, next following the positive going leading edge of the last pulse of input signal 14 as at time $t_3$.

Because the frequency $F_C$ of clock signal 10 is a known quantity, and because the number of counts $N_C$ of clock count 12 during the sample time $T_S$ is also a known quantity it is thus possible to accurately determine the time duration $T_C$ over the time $t_1$ through $t_4$. Thus, to determine the time duration of the input signal $T_I$ over the time duration $t_0$ through $t_3$ it is merely necessary to modify the time $T_C$ by adding thereto the correcting time duration $\Delta T_L$ over the duration $t_0$ through $t_1$ and subtract the correcting time duration $\Delta T_T$ over the time duration $t_3$ through $t_4$. These correcting time durations $\Delta T_L$ and $\Delta T_T$ are generated by the frequency-to-digital converter and provided as gating pulses 18 and 20, respectively, to the time expander circuit of FIG. 2 as the gating signal to gate gating means 24 at input terminal 26.

Figure 3:
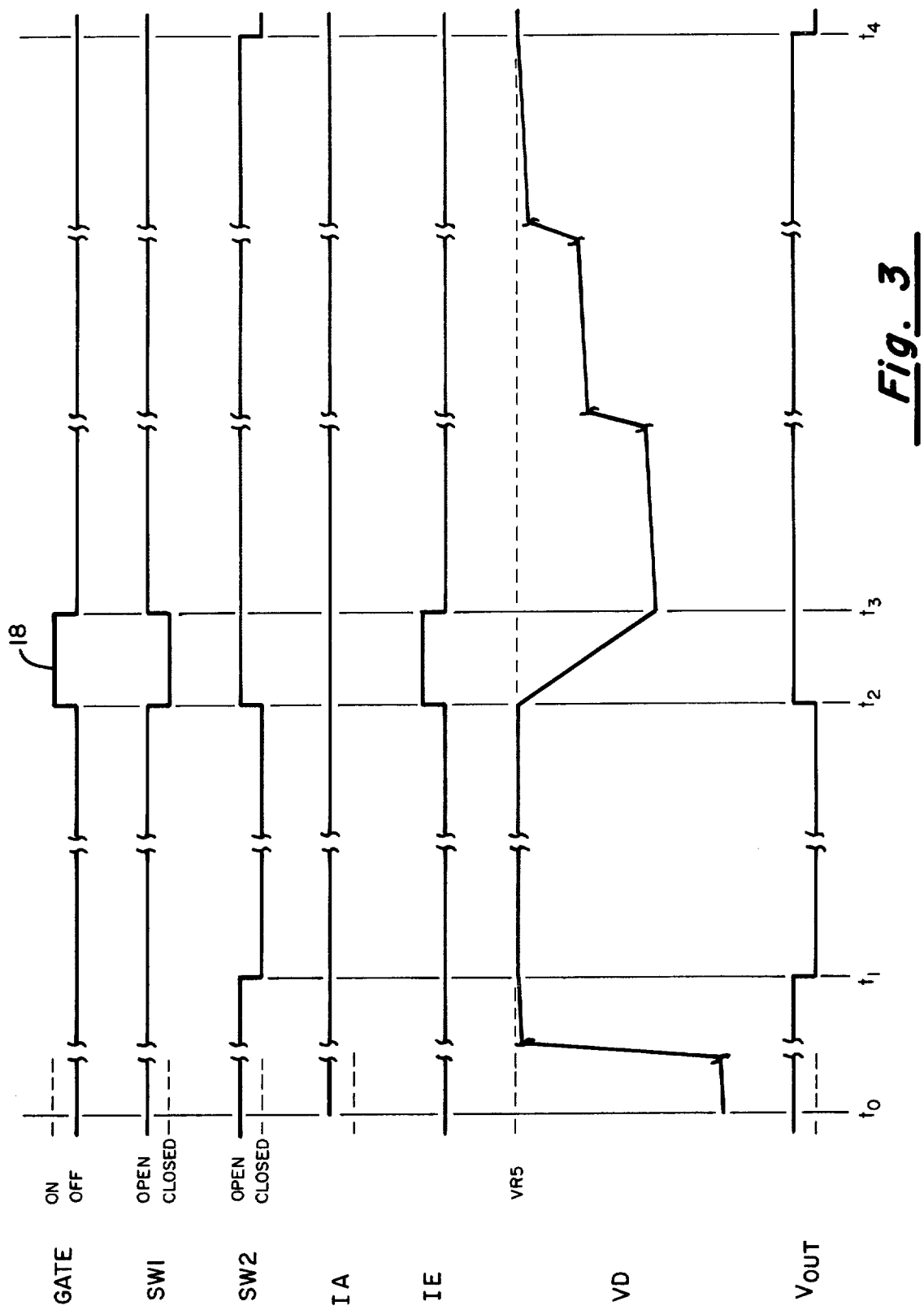
FIG. 3 is an illustration of the waveforms of a timing diagram associated with the time expander circuit of FIG. 2.

With particular reference to FIG. 3 there is presented an illustration of the waveforms of a timing diagram associated with the time expander circuit of FIG. 2. At time $t_0$ when power is initially applied to the circuit, the timing capacitor C1 is charged at node D from the constant current source 30, which is formed of operational amplifier A1, zener diode D1, variable resistor RV and resistor R1, through resistor RD. When the voltage on timing capacitor C1 reaches a predetermined value of VR5, which is a first input to operational amplifier A3, operational amplifier A3 is activated — operational amplifier A3 functions as a comparator for comparing the voltage potential VD at node D to reference voltage VR5 — which, in turn, activates switch SW2. Switch SW2, in turn, provides a current sink path to current sink VR4 at one input to switch SW2, for the excess current that is supplied by the constant current source 30. Note that from the time $t_1$ when the charge on timing capacitor C1 at node D reaches the reference voltage VR5 until the time $t_2$, switch SW2 functions to drain off the excess current from constant current source 30 while maintaining the charge on timing capacitor C1 at the reference voltage level of VR5 as determined by operational amplifier A3.

Now, at time $t_2$ the gating pulse 18, as illustrated in FIG. 1, is coupled to the input terminal 26 of gating means 24. Gating pulse 18, at time $t_2$, enables gating means 24 to switch switch SW1 into its Closed condition. The closing of switch SW1 switches resistor RE — see FIG. 4 —, which resistor RE is coupled to the constant current sink 32 via node E, from reference voltage VR2 via transistor 40 to reference voltage VR2 via transistor 42 and, accordingly, to timing capacitor C1. Reference voltage VR2 had previously, i.e., from time $t_0 - t_2$, supplied current to constant current sink 32, consisting of operational amplifier A2, zener diode D2 and resistor R2. The constant current requirement of constant current sink 32 is then, i.e., at time $t_2$, supplied by the charge on timing capacitor C1 and the constant current that is available from constant current source 30. The drain of the charge from timing capacitor C1 reduces the voltage potential VD at node D which reduced voltage potential is then below the level of the reference voltage VR5. This deactivates operational amplifier A3 which switches its output signal $V_{OUT}$ at time $t_2$ to a new high level and also disables switch SW2 disconnecting timing capacitor C1 at node D from the reference voltage VR4 — see FIG. 5. This new high level of the output signal $V_{OUT}$ at output terminal 36 of operational amplifier A3 is sensed by level detection circuitry of the frequency-to-digital converter as a start enable signal. The frequency-to-digital converter then beginning at time $t_2$ will measure and record the time that this level of the output signal $V_{OUT}$ is maintained at output terminal 36 of operational amplifier A3.

Next, at the termination of the gating pulse 18, as at time $t_3$, gating means 24 is deactivated, switching switch SW1 into its Open position. In a reverse procedure as at time $t_2$, resistor RE is removed from node D and timing capacitor C1 and returned to reference voltage VR2 via transistor 40 - see FIG. 4. The current flow from constant current source 30 will now replace the charge that was drained from timing capacitor C1 during the time $t_2 - t_3$ that current sink network 32 was coupled to node D and timing capacitor C1. This recharging of timing capacitor C1 is at a constant rate until the voltage potential VD across timing capacitor C1 measured at node D, which is a second input 34 to operational amplifier A3, has returned to the level of reference voltage VR5 which is a first input 38 to operational amplifier A3.

The time period $t_2 - t_4$ that is required to restore the charge of timing capacitor C1 to the level of reference voltage VR5 is the product of the current ratio N multiplied by the discharge time period, i.e., $T_C$(Charge) = N × $T_D$(Discharge). When the level of the voltage potential VD at node D at timing capacitor C1 and at the second input 34 to operational amplifier A3 reaches the level of reference voltage VR5 at the first input 38 to operational amplifier A3, the voltage level at the output 36 of operational amplifier A3 is dropped back to its original low state, as at time $t_4$, which low level output of operational amplifier A3 again activates, or closes, switch SW2. The current supplied by the constant current source 30 is again coupled to reference voltage VR4 and the voltage potential across the plates of timing capacitor C1 stabilizes and remains constant at the level of reference voltage VR5 in a manner similar to that during the time duration $t_1 - t_2$. The change in the level of the output signal $V_{OUT}$ at output terminal 36 of operational amplifier A3 is sensed by the level detection circuitry of the frequency-to-digital converter as a stop enable signal which disables further time measurement of the time expander circuit by the frequency-to-digital converter.

Figure 4:
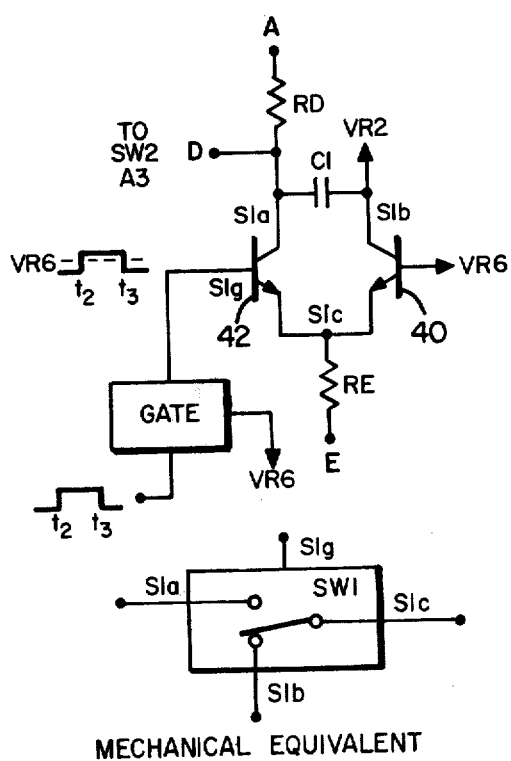
FIG. 4 is a detail circuit schematic of one implementation of switch 1 of the circuit schematic of FIG. 2.
Figure 5:
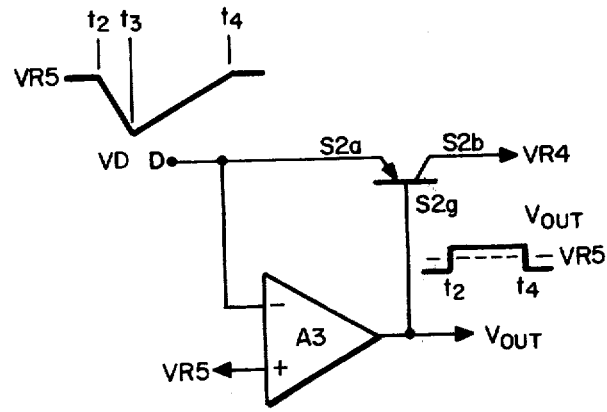
FIG. 5 is a detail circuit schematic of one implementation of switch 2 of the time expander circuit of FIG. 2.
Figure 5:
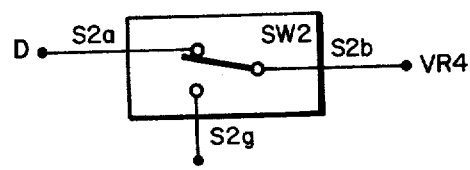

With particular reference to FIGS. 4 and 5, there are presented the detail circuit schematics of one implementation of switches SW1 and SW2 of the time expander circuit of FIG. 2. With reference to FIG. 2, resistors RA and RB are not essential to proper circuit operation; however, they are included only to reduce the power dissipation of the integrated circuit operational amplifiers A1 and A2, respectively. Additionally, resistors RD and RF are not essential to proper circuit operation; however, they are included to attenuate the voltage change at the inputs of integrated circuit operational amplifiers A1 and A2, respectively. Reference voltages VR1, VR2, VR3, VR4, VR5 and VR6 may be selected to be convenient for any of the various component values that may be utilized to implement the time expander circuit of FIG. 2. Further, reference voltages VR1 and/or VR3 may be omitted if resistors RA and/or RB, respectively, are not utilized.

The use of the same type of integrated circuit components for operational amplifiers A1 and A2 and for zener diodes D1 and D2 implies that they will have very similar, and virtually identical, characteristics over their operating temperature range. Thus, the current ratio N that is established by the resistor ratio will remain constant over that temperature range even if the voltage across the resistors varies, since the voltage variation across one current determining resistor will be the same as the voltage variation across the other, i.e., $\Delta V1(T) = \Delta V2(T)$, where $\Delta V1(T)$ is a change of voltage due to temperature variation across resistors R1 and RV and $\Delta V2(T)$ is a change of voltage due to the same temperature variation across resistor R2.

The current ratio N will remain constant, and therefore, the time ratio of charge and discharge of timing capacitor C1 will remain constant. Diode D1 and operational amplifier A1 provide a means for maintaining a constant voltage across the series resistor connection consisting of resistor R1 and the variable resistor RV. Operational amplifier A1 is an operational amplifier with a feedback connection to cause it to operate as a voltage follower, i.e., the amplifier output voltage level at node B is at the same electric potential as the amplifier input voltage level at node A. Diode D1 is a commercially available integrated circuit designed to simulate ideal voltage-current breakdown characteristics of a zener diode at a low voltage ($\approx 1.2V$) across the circuit, i.e., at the breakdown voltage a relatively large magnitude current change through the diode will produce only a minor voltage variation across the diode terminals. Since the voltage level at node B is constrained to be at the same potential as the voltage level at node A by the voltage follower operational amplifier A1, and since the diode D1 and the series resistor combination of resistor R1 and resistor RV are both connected to node C, the voltage drop across the series resistor combination R1 and resistor RV is equal to the voltage drop across the diode D1.

The input impedance of operational amplifier A1 is selected to be relatively high ($\approx 100$ megohms). Thus, the current IA flowing from node A into resistor RD is a constant current and its value is very closely approximated as the quotient of the value of the diode D1 breakdown voltage divided by the sum of the values of the series resistors R1 and RV, i.e., $IA = (VC - VB) \div (R1 + RV)$. Resistor RC limits the current drain, and provides isolation of the constant current source 30, from the voltage source VS1. Resistor RA is a sink for the diode D1 current and the operational amplifier A1 output current, reducing operational amplifier A1 power dissipation.

Diode D2 and operational amplifier A2 provide a constant current sink by maintaining a constant voltage drop across resistor R2 in a manner similar to the operation of the constant current source 30. The voltage level at node G is constrained to be at the same potential as the voltage level at node E by the operation of the voltage follower operational amplifier A2. The zener diode D1 and the resistor R2 have a common terminal at node F, so that current drain into resistor R2 from node E (operational amplifier A2 is chosen to have a very high input impedance) is the quotient of the voltage drop across zener diode D2 divided by the value of resistor R2, i.e., $IE = (VG - VF) \div R2$. Resistor RB is a source of current for zener diode D2 to reduce the current output and power that is dissipated by operational amplifier A2. Resistor RF is the current sink path for the zener diode D2 current and the constant current through R1 through the current sink of voltage source VS2.

Operational amplifiers A1 and A2 are of the same integrated circuit construction, while zener diodes D1 and D2 are also of the same commercially available integrated circuit construction. Therefore, it may be assumed that they have very similar and almost identical characteristics. Therefore, the ratio (N) of the current flowing into the current sink 32 to the current supplied by the current source 30 is equal to the inverse ratio of the associated resistors, i.e., $N = IE \div IA = 1 \div R2 \div (R1 + RV) = (R1 + RV) \div R2$. Thus, the ratio of source current to sink current may be fixed by selecting their associated resistors in the inverse ratio. Resistor R1 may be selected to be smaller in value than the value required by the ratio, and variable resistor RV may be adjusted to precisely fix the current ratio N. Variable resistor RV is not an indispensable component of the network; however, it is included to facilitate calibration of the time expander circuit, and to permit corrective action for variation in the circuit parameters of the operational amplifiers A1 and A2 and zener diodes D1 and D2 of the constant current networks 30 and 32. It is possible to determine the precise value of resistor R1 that is required to provide the desired current ratio within a selected and assembled set of components, and to manufacture a resistor to a precise value and thus eliminate resistor RV from the assembly. However, this would require abnormal expenditures of time and money and would be justified only by unusual circumstances.

What is claimed is:
1. A time expander circuit, comprising:
a current source;
a current sink;
first switch means;
second switch means;
capacitor means;
means for continuously coupling said current source to a first node;
means for coupling a first terminal of said capacitor means to said first node;
means for coupling a second terminal of said capacitor means to a first reference voltage;
means for coupling a first terminal of said first switch means to said first reference voltage;
means for coupling a second terminal of said first switch means to said first node;
means for coupling a first terminal of said second switch means to said first node;
means for coupling said current sink to a third terminal of said first switch means;
comparator means coupling said first node to a second reference voltage for establishing the maximum voltage potential of said first node at said second reference voltage;
means coupling a gating pulse, having a duration T, to a fourth terminal of said first switch means for selectively closing said first switch means only during said duration T and selectively switching said current sink from said first reference voltage to said first node only during said duration T;
said gating pulse of duration T controlling said comparator means for generating, at an output terminal of said comparator means, an output signal $V_{OUT}$ whose duration 0 is a predetermined, time expanded multiple of said gating pulse duration T.

2. A time expander circuit, comprising:
a constant current source having an output terminal A;
a constant current sink having an input terminal E;
switch means SW1 having first, second, third and fourth terminals;
switch means SW2 having first, second and third terminals;
comparator means A3 having first and second input terminals and an output terminal;
capacitor means C1 having first and second terminals;
means RD for continuously coupling the output terminal A of said constant current source to a node D;
means for coupling the first terminal of said capacitor means C1 to said node D;
means coupling the second terminal of said capacitor means C1 to a reference voltage VR2 for coupling said capacitor means C1 between said node D and said reference voltage VR2;
means for coupling the first terminal of said switch means SW1 to said node D;

means for coupling the first terminal of said switch means SW2 to said node D;

means RE for coupling the input terminal E of said constant current sink to the second terminal of said switch means SW1;

means coupling the third terminal of said switch means SW1 to the second terminal of said capacitor means C1 for coupling said capacitor means C1 between the first and third terminals of said switch means SW1;

gating means coupled to the fourth terminal of said switch means SW1 for selectively coupling said constant current sink input terminal E to said node D and thence to said reference voltage VR2 via said capacitor means C1 when said switch means SW1 is closed, or, alternatively, coupling said constant current sink input terminal E directly to said reference voltage VR2 when said switch means SW1 is open;

means coupling the first terminal of said switch means SW2 to the first input terminal of said comparator means A3;

means coupling the second terminal of said switch means SW2 to the output terminal of said comparator means A3;

means coupling the second input terminal of said comparator means A3 to a reference voltage VR5, said comparator means A3 comparing the voltage potential at said node D to said reference voltage VR5 for closing said switch means SW2 whenever the voltage potential at said node D equals or exceeds said reference voltage VR5 and establishing the maximum voltage potential of said node D at said reference voltage VR5;

means coupling a gating pulse having a duration T to said gating means for closing said switch means SW1 only during said duration T;

said constant current source having a predetermined constant charging rate $R_C$ for charging said capacitor means C1 to said reference voltage VR5 level;

said constant current sink having a predetermined constant discharging rate $R_D$ for discharging said capacitor means C1 during the duration T that said switch means SW1 is closed, said discharging rate $R_D$ being substantially higher than said charging rate $R_C$;

said gating pulse of duration T controlling said comparator means A3 for generating at its output terminal an output signal $V_{OUT}$ whose duration 0 is a predetermined, time expanded representation of said gating pulse duration T.

3. The time expander circuit of claim 2 in which said first switch means includes:

first and second similar type transistors each having collector, emitter and base electrodes;

means intercoupling the emitter electrodes of said first and second transistors for forming said second terminal;

means coupled to the collector electrode of said first transistor for forming said first terminal;

means coupled to the collector electrode of said second transistor for forming said third terminal; and, means coupled to the base electrode of said first transistor for forming said fourth terminal.

* * * * *